(12) United States Patent
Hiyama (10) Patent No.: US 7,547,992 B2
(45) Date of Patent: Jun. 16, 2009

(54) DRIVE DEVICE DRIVING A PLURALITY OF SEMICONDUCTOR ELEMENTS HAVING RESPECTIVE REFERENCE POTENTIAL ELECTRODES COUPLED VIA A MAIN ELECTRODE UNIT AND ALTERNATING CURRENT POWER SUPPLY DEVICE PROVIDED WITH THE DRIVE DEVICE

(75) Inventor: Kazuaki Hiyama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 67 days.

(21) Appl. No.: 11/933,741

(22) Filed: Nov. 1, 2007

(65) Prior Publication Data

US 2008/0297964 A1    Dec. 4, 2008

(30) Foreign Application Priority Data

Jun. 4, 2007    (JP)    ............................... 2007-148314

(51) Int. Cl.
*H01H 19/64*    (2006.01)
(52) U.S. Cl. ..................................................... 307/113
(58) Field of Classification Search .................. 307/113
See application file for complete search history.

(56) References Cited

FOREIGN PATENT DOCUMENTS

| JP | 2001-43990 | 2/2001 |
|---|---|---|
| JP | 2001-45740 | 2/2001 |
| JP | 2003-339152 | 11/2003 |
| JP | 2006-229454 | 8/2006 |
| WO | WO 01/01555 A1 | 1/2001 |
| WO | WO 01/89090 A1 | 11/2001 |

*Primary Examiner*—Robert L. DeBeradinis
(74) *Attorney, Agent, or Firm*—Oblon, Spivak, McClelland, Maier & Neustadt, P.C.

(57) ABSTRACT

A first bypass circuit has first and second nodes. The first load circuit is connected between the first node and a signal input terminal of the second drive circuit. The second load circuit has substantially the same impedance as the first load circuit, and is connected between the second node and the reference potential terminal of the second drive circuit. The first drive circuit has the same reference potential as the input buffer. The second bypass circuit passes a signal of a predetermined frequency or higher between a current path formed between the first load circuit and the signal input terminal of the second drive circuit and a current path formed between the second load circuit and the reference potential terminal of the second drive circuit. The first bypass circuit passes a signal of a predetermined frequency or higher between the first and second nodes.

8 Claims, 6 Drawing Sheets

DRIVE DEVICE DRIVING A PLURALITY OF SEMICONDUCTOR ELEMENTS HAVING RESPECTIVE REFERENCE POTENTIAL ELECTRODES COUPLED VIA A MAIN ELECTRODE UNIT AND ALTERNATING CURRENT POWER SUPPLY DEVICE PROVIDED WITH THE DRIVE DEVICE

BACKGROUND OF THE INVENTION

1. Field of the Invention

The present invention relates to a drive device and an alternating current (hereafter, also referred to as AC) power supply device provided with the drive device, and particularly to a drive device driving a plurality of semiconductor elements having respective reference potential electrodes coupled via a main electrode unit as well as an AC power supply device provided with the drive device.

2. Description of the Background Art

A drive device driving semiconductor elements may include, e.g., a plurality of semiconductor elements coupled in parallel. In this structure, a parasitic inductance is present in each of interconnections between the semiconductor elements. Therefore, when the semiconductor element performs a switching operation to supply intermittently an output current, an induced electromotive force occurs in a parasitic inductance.

In a general power semiconductor element, a change rate of current at the time of switching is about 3000 A/μs. Therefore, when the parasitic inductance is 10 nH (nanohenry), the induced electromotive force is equal to (10 n×3000/1μ=30 (V)). This induced electromotive force destroys the semiconductor element, and causes a malfunction of circuits.

International Publication No. WO 01/001555 brochure, Japanese Patent Laying-Open Nos. 2001-043990, 2006-229454, 2003-339152 and 2001-045740, and International Publication No. WO 01/089090 brochure (publications 1-6) have disclosed structures driving semiconductor elements, and particularly structures for preventing a large voltage such as an induced electromotive force that may instantaneously occurs, and thereby preventing destruction and malfunctions of circuits.

For example, the publication 1 has disclosed the following structure. In a power conversion circuit that converts a direct current into an alternating current or the like to supply a power to a load, the disclosed structure aims to prevent a malfunction and destruction due to a surge voltage. This structure includes a level shift circuit that is arranged corresponding to a switching semiconductor element forming a main circuit, and performs level shifting of a reference potential on an output side in a manner following variations in reference potential of the switching semiconductor element. A control signal is transmitted via the level shift circuit to the switching semiconductor element. A direct current control power supply supplying the power to the level shift circuit is connected to a negative pole of the switching semiconductor element via at least one of the inductance and the resistance.

The publication 2 has disclosed the following structure. An output terminal of a bridge drive circuit is connected to gate terminals of four MOS transistors in an H-bridge circuit via resistances. At least one of four MOS transistor drive circuits has an output terminal connected to an interconnection providing a negative-side reference potential via a capacitor. By this structure, an integrating circuit formed of the resistance and the capacitor operates as a filter to prevent application of a high voltage to the MOS transistor drive circuit.

However, the publications 1-6 have not disclosed a structure that is employed in a drive device driving, based on a common drive control signal, a plurality of semiconductor elements having respective reference potential electrodes coupled via a main electrode unit, and reduces an influence of an induced electromotive force caused by a switching operation of the semiconductor element.

SUMMARY OF THE INVENTION

An object of the invention is to provide a drive device that drives, based on a common drive control signal, a plurality of semiconductor elements having respective reference potential electrodes coupled via a main electrode unit, and can reduce an influence of an induced electromotive force caused by a switching operation of the semiconductor element, and is to provided an AC power supply device provided with the drive device.

A drive device according to an aspect of the invention is a drive device driving first and second semiconductor elements having respective reference potential electrodes coupled via a main electrode unit, and includes an input buffer receiving a drive control signal; a first bypass circuit including first and second nodes, receiving an output signal of the input buffer and providing a signal from the first node; a first drive circuit including a reference potential terminal coupled to a reference potential electrode of the input buffer, the second node of the first bypass circuit and the reference potential electrode of the first semiconductor element, and a signal input terminal receiving the output signal from the first node of the first bypass circuit, and supplying a voltage to a control electrode of the first semiconductor element; a second drive circuit including a reference potential terminal coupled to the second node of the first bypass circuit and the reference potential electrode of the second semiconductor element, and a signal input terminal receiving the output signal form the first node of the first bypass circuit, and supplying a voltage to a control electrode of the second semiconductor element; a first load circuit connected between the first node of the first bypass circuit and the signal input terminal of the second drive circuit; a second load circuit having substantially the same impedance as the first load circuit, and connected between the second node of the first bypass circuit and the reference potential terminal of the second drive circuit; and a second bypass circuit passing a signal of a predetermined frequency or higher between a current path formed between the first load circuit and the signal input terminals of the second drive circuit and a current path formed between the second load circuit and the reference potential terminal of the second drive circuit. The first bypass circuit passes a signal of a predetermined frequency or higher between the first and second nodes.

An AC power supply device according to an aspect of the invention, includes a main electrode unit; first and second semiconductor elements having respective reference potential electrodes coupled via the main electrode unit; an input buffer receiving a drive control signal; a first bypass circuit including first and second nodes, receiving an output signal of the input buffer and providing a signal from the first node; a first drive circuit including a reference potential terminal coupled to a reference potential terminal of the input buffer, the second node of the first bypass circuit and the reference potential electrode of the first semiconductor element, and a signal input terminal receiving an output signal from the first node of the first bypass circuit, and supplying a voltage to a control electrode of the first semiconductor element; a second drive circuit including a reference potential terminal coupled to the second node of the first bypass circuit and the reference potential electrode of the second semiconductor element, and a signal input terminal receiving the output signal from the first node of the first bypass circuit, and supplying a voltage to a control electrode of the second semiconductor element; a first load circuit connected between the first node of the first bypass circuit and the signal input terminal of the second drive circuit; a second load circuit having substantially the same impedance as the first load circuit, and connected between the second node of the first bypass circuit and the reference potential terminal of the second drive circuit; and a second bypass circuit passing a signal of a predetermined frequency or higher between a current path formed between the first load circuit and the signal input terminal of the second drive circuit and a current path formed between the second load circuit and the reference potential terminal of the second drive circuit. The first bypass circuit passes a signal of a predetermined frequency or higher between the first and second nodes.

According to the invention, the plurality of semiconductor elements having respective reference potential electrodes coupled via the main electrode unit are driven based on the common drive control signal, and an influence of an induced electromotive force caused by the switching operation of the semiconductor elements can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers, and description thereof is not repeated.

First Embodiment

[Structure and Basic Operation]

Figure 1:
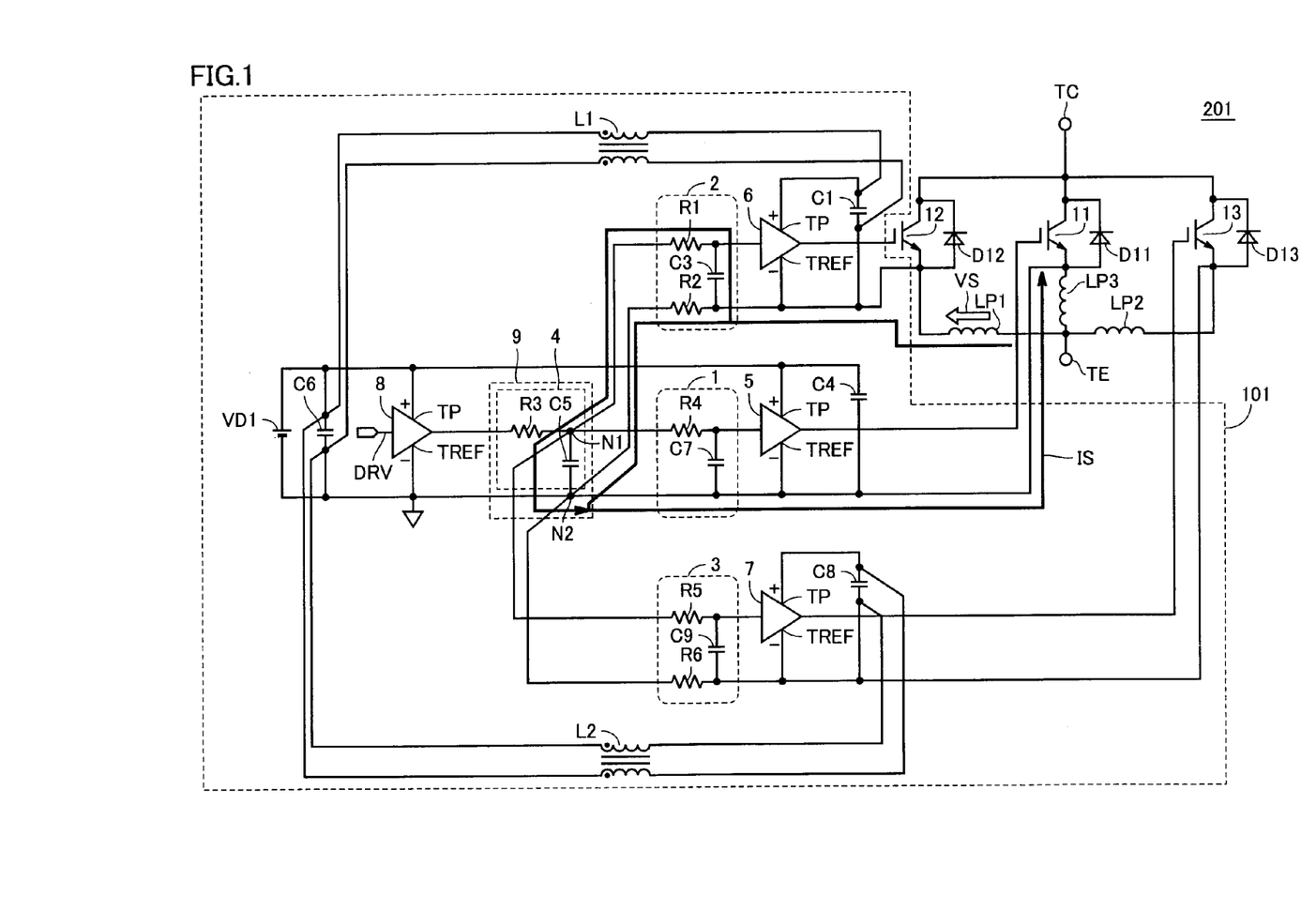
FIG. 1 is a circuit diagram showing a structure of an AC power supply device 201 according to a first embodiment of the invention.

FIG. 1 is a circuit diagram showing a structure of an AC power supply device 201 according to a first embodiment of the invention.

Referring to FIG. 1, AC power supply device 201 includes a drive device 101, switch elements (first to third semiconductor elements) 11-13, diodes D11-D13, a collector main electrode terminal TC and an emitter main electrode terminal TE. Drive device 101 includes low-pass filters 1-3, a drive circuit (first drive circuit) 5, a drive circuit (second drive circuit) 6, a drive circuit (second drive circuit) 7, an input buffer 8, a bypass circuit (first bypass circuit) 9, a power supply VD1, common mode inductors L1 and L2, and capacitors C1, C4, C6 and C8. Bypass circuit 9 includes a low-pass filter 4. Low-pass filter (first low-pass filter) 1 includes a resistance R4 and a capacitor C7. Low-pass filter (second low-pass filter) 2 includes a resistance (first load circuit) R1, a resistance (second load circuit) R2 and a capacitor (second bypass circuit) C3. Low-pass filter 3 includes a resistance (first load circuit) R5, a resistance (second load circuit) R6 and a capacitor (second bypass circuit) C9. Low-pass filter 4 includes a resistance R3 and a capacitor C5. Bypass circuit 9 includes a node N1 corresponding to a connection node of a second end of resistance R3 and a first end of capacitor C5, and also includes a node N2 corresponding to a second end of capacitor C5.

Each of switch elements 11-13 has a control emitter CE and a current output emitter IE (i.e., emitter for current output) as will be described later with reference to FIG. 2. Control emitter CE of the switch element is employed for controlling a voltage supplied to the gate electrode of the switch element, and current output emitter IE is employed for passing a large current. In the following descriptions, control emitter CE and current output emitter IE may be generally referred to as "emitters" hereinafter.

Resistance R3 has a first end connected to an output terminal of input buffer 8 and a second end connected to a first end of capacitor C5, a first end of resistance R4, a first end of resistance R1 and a first end of resistance R5. A second end of resistance R1 is connected to a first end of capacitor C3 and a signal input terminal of drive circuit 6. A reference potential terminal TREF of drive circuit 6 is connected to emitters of switch elements 11-13, a second end of capacitor C1, a second end of capacitor C3 and a second end of resistance R2. A second end of resistance R4 is connected to a first end of capacitor C7 and a signal input terminal of drive circuit 5. A reference potential terminal TREF of drive circuit 5 is connected to emitters of switch elements 11-13, a second end of capacitor C4, a second end of capacitor C5, a second end of capacitor C7, a reference potential terminal TREF of input buffer 8, a first end of resistance R2, a first end of resistance R6, a second end of capacitor C6 and a negative electrode of power supply VD1. A second end of resistance R5 is connected to a first end of capacitor C9 and a signal input terminal of drive circuit 7. Reference potential terminal TREF of drive circuit 7 is connected to emitters of switch elements 11-13, a second end of capacitor C8, a second end of capacitor C9 and a second end of resistance R6.

Collectors of switch elements 11-13 are connected to cathodes of diodes D11-D13, respectively. Emitters of switch elements 11-13 are connected to anodes of diodes D11-D13, respectively.

A power supply terminal TP of drive circuit 5, a first end of capacitor C4, a power supply terminal TP of input buffer 8 and a first end of capacitor C6 are connected to a positive electrode of power supply VD1. A power supply end TP of drive circuit 6 and a first end of capacitor C1 are connected to the positive electrode of power supply VD1 via a common mode inductor L1. Reference potential terminal TREF of drive circuit 6 and the second end of capacitor C1 are connected to a negative electrode of power supply VD1 via common mode inductor L1. A power supply terminal TP of drive circuit 7 and a first end of capacitor C8 are connected to the positive electrode of power supply VD1 via a common mode inductor L2. Reference potential terminal TREF of drive circuit 7 and the second end of capacitor C8 are connected to the negative electrode of power supply VD1 via common mode inductance L2. More specifically, common mode inductor L1 is arranged between power supply VD1 and drive circuit 6. Common mode inductor L2 is arranged between power supply VD1 and drive circuit 7. Output terminals of drive circuits 5, 6 and 7 are connected to gates (control electrodes) of switch elements 11, 12 and 13, respectively. Although drive device 101 has common mode inductors L1 and L2, it may have another structure. Drive device 101 may have a structure employing two inductors instead of common mode inductors L1 and L2, respectively.

Drive device 101 drives switch elements 11-13 based on an externally provided drive control signal DRV.

Input buffer 8 externally receives drive control signal DRV, and amplifies drive control signal DRV so that the voltage amplitude of drive control signal DRV may take a value required for driving switch elements 11-13.

Low-pass filter 4 in bypass circuit 9 attenuates frequency components of a predetermined frequency or higher among frequency components of drive control signal DRV, i.e., an output signal of input buffer 8. Bypass circuit 9 distributes drive control signal DRV passed through low-pass filter 4 to low-pass filters 1-3 via node N1.

Low-pass filter 1 is connected between node N1 of bypass circuit 9 and the signal input terminal of drive circuit 5. Low-pass filter 2 is connected between node N1 of bypass circuit 9 and the signal input terminal of drive circuit 6. Low-pass filter 3 is connected between node N1 of bypass circuit 9 and the signal input terminal of drive circuit 7. Each of low-pass filters 1-3 attenuates frequency components of a predetermined frequency or higher among the frequency components of drive control signal DRV received from bypass circuit 9.

Each of low-pass filters 1-4 may include an inductance instead of the resistance.

Drive circuits 5-7 receive drive control signal DRV passed through low-pass filters 1-3, and provide voltages to gates of switch elements 11-13, respectively. Drive circuits 5-7, for example, do not amplify the voltage of drive control signal DRV in contrast to input buffer 8. Thus, drive circuits 5-7 have a voltage gain of one. Drive circuits 5-7 can drive loads of low impedances, for example, because output resistances thereof are small.

Switch elements 11-13 are connected in parallel. More specifically, each collector of switch elements 11-13 is connected to collector main electrode terminal TC, and each emitter (reference potential electrode) thereof is connected to emitter main electrode terminal TE. Switch elements 11-13 are switched between the on and off states based on drive control signal DRV received from drive circuits 5-7, respectively.

Bypass circuit 9 couples reference potential terminals TREF of drive circuits 5 and 6 via resistance R2.

Resistance R1 is connected between node N1 of bypass circuit 9 and the signal input terminal of drive circuit 6. Resistance R2 has substantially the same impedance as resistance R1, and is connected between node N2 of bypass circuit 9 and the reference potential terminal of drive circuit 6.

Capacitor C3 passes a signal of a predetermined frequency or higher between the second end, i.e., the end on the drive circuit 6 side of resistance R1 and the second end, i.e., the end on the drive circuit 6 side of resistance R2. Thus, capacitor C3 passes the signal of the predetermined frequency or higher between a current path formed between resistance R1 and the signal input terminal of drive circuit 6 and a current path formed between resistance R2 and the reference potential terminal of drive circuit 6.

Resistance R4 is connected between node N1 of bypass circuit 9 and the signal input terminal of drive circuit 5.

Bypass circuit 9 passes a signal of a predetermined frequency or higher between the first end, i.e., the end on the bypass circuit 9 side of resistance R1 and the first end, i.e., the end on the bypass circuit 9 side of resistance R2. Thus, bypass circuit 9 passes the signal of the predetermined frequency or higher between nodes N1 and N2.

Bypass circuit 9 couples reference potential terminals TREF of drive circuits 5 and 7 via resistance R6.

Resistance R5 is connected between node N1 of bypass circuit 9 and the signal input terminal of drive circuit 7. Resistance R6 has substantially the same impedance as resistance R5, and is connected between node N2 of bypass circuit 9 and the reference potential terminal of drive circuit 7.

Capacitor C9 passes a signal of a predetermined frequency or higher between the second end, i.e., the end on the drive circuit 7 side of resistance R5 and the second end, i.e., the end on the drive circuit 7 side of resistance R6. Thus, capacitor C9 passes the signal of the predetermined frequency or higher between the current path formed between resistance R5 and the signal input terminal of drive circuit 7 and the current path formed between resistance R6 and the reference potential terminal of drive circuit 7.

Bypass circuit 9 passes a signal of a predetermined frequency or higher between the first end, i.e., the end on the bypass circuit 9 side of resistance R5 and the first end, i.e., the end on the bypass circuit 9 side of resistance R6. Thus, bypass circuit 9 passes the signal of the predetermined frequency or higher between nodes N1 and N2.

Figure 2:
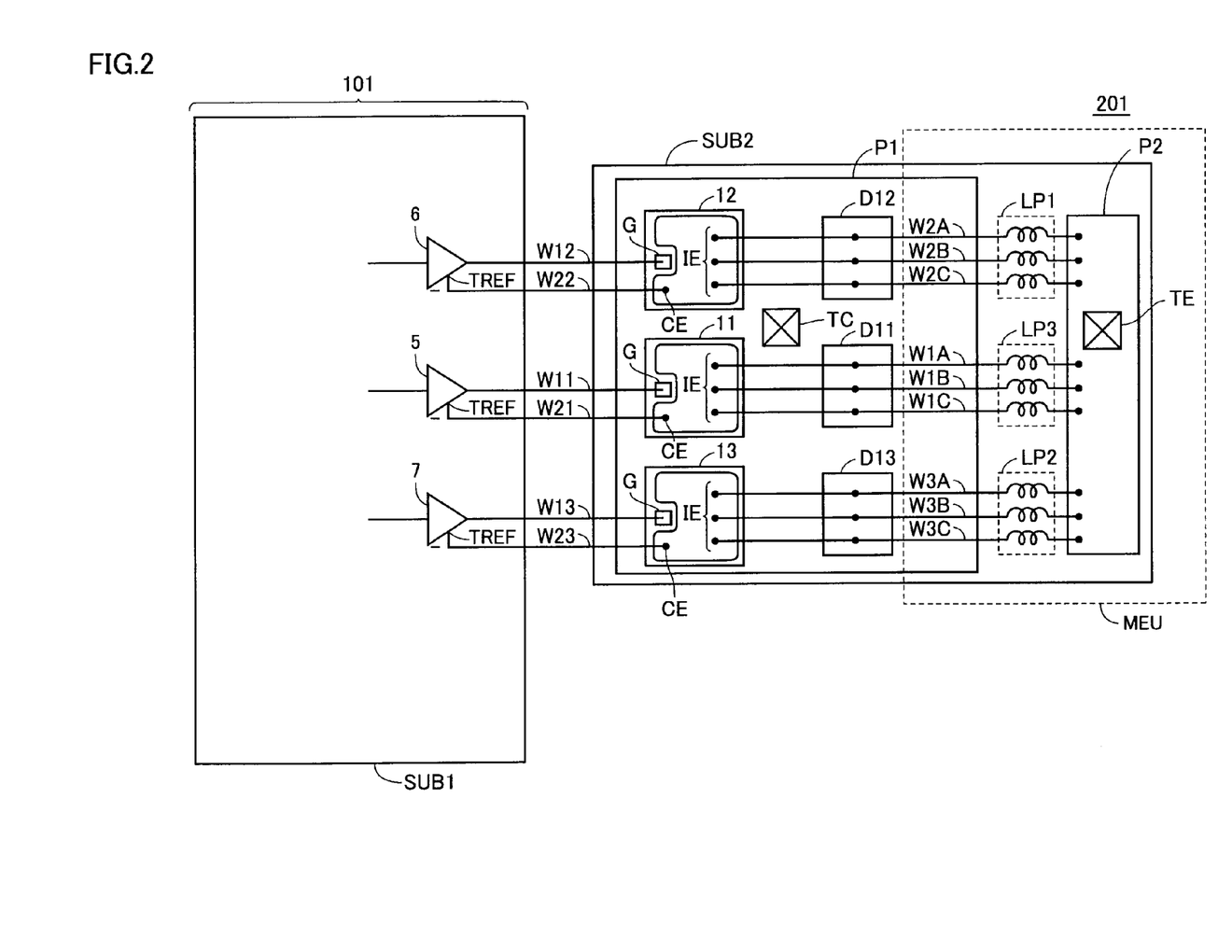
FIG. 2 shows a structure of AC power supply device 201 according to the first embodiment of the invention.

FIG. 2 shows a structure of AC power supply device 201 according to the first embodiment of the invention.

Referring to FIG. 2, AC power supply device 201 includes drive device 101 and an insulated circuit board SUB2.

Drive device 101 includes a circuit board SUB1. More specifically, Low-pass filters 1-3, drive circuits 5-7, input buffer 8, bypass circuit 9, power supply VD1, common mode inductances L1 and L2, and capacitors C1, C4, C6 and C8 are arranged on circuit board SUB1.

Insulated circuit board SUB2 is formed of, e.g., a ceramic substrate provided at its opposite surfaces with metal patterns, respectively. More specifically, metal patterns P1 and P2 are formed on one of main surfaces of insulated circuit board SUB2. A semiconductor chip forming switch elements 11-13, a semiconductor chip forming diodes D11-D13 and a collector main electrode terminal TC are arranged on metal pattern P1. Emitter main electrode terminal TE is arranged on Metal pattern P2.

The output terminal of drive circuit 5 is connected to a gate G of switch element 11, e.g., via an aluminum wire W11. Reference potential terminal TREF of drive circuit 5 and control emitter CE of switch element 11 are connected, e.g., via an aluminum wire W21.

Current output emitter IE of switch element 11, the anode of diode D11 and metal pattern P2 are connected via three aluminum wires W1A, W1B and W1C.

Likewise, the output terminal of drive circuit 6 and gate G of switch element 12 are connected, e.g., via an aluminum wire W12. Reference potential terminal TREF of drive circuit 6 and control emitter CE of switch element 12 are connected, e.g., via an aluminum wire W22.

Current output emitter IE of switch element 12, the anode of diode D12 and metal pattern P2 are connected, e.g., via three aluminum wires W2A, W2B and W2C.

Likewise, the output terminal of drive circuit 7 and gate G of switch element 13 are connected, e.g., via an aluminum wire W13. Reference potential terminal TREF of drive circuit 7 and control emitter CE of switch element 13 are connected, e.g., via an aluminum wire W23.

Current output emitter IE of switch element 13, the anode of diode D13 and metal pattern P2 are connected, e.g., via three aluminum wires W3A, W3B and W3C.

The number of aluminum wires connecting current output emitters IE of the switch elements, the anodes of diodes and metal pattern P2 are appropriately determined according to a current quantity and the like.

Emitter main electrode terminal TE, aluminum wires W1A, W1B, W1C, W2A, W2B, W2C, W3A, W3B and W3C, and metal pattern P2 form an emitter main electrode unit MEU of AC power supply device 201. Thus, current output emitters IE of switch elements 11, 12 and 13 are connected via emitter main electrode unit MEU.

Collectors of switch elements 11, 12 and 13, cathodes of diodes D11, D12 and D13, and collector main electrode terminal TC are connected via metal pattern P1.

A large current flows through parasitic inductance LP1, LP2 and LP3 in aluminum wires W1A, W1B, W1C, W2A, W2B, W2C, W3A, W3B and W3C. Therefore, induced electromotive forces occurring in parasitic inductance LP1, LP2 and LP3 may cause a problem as already described.

[Operation]

When the induced electromotive force occurs in parasitic inductance LP1 of AC power supply device 201 according to a first embodiment of the invention, the operation is performed as follows.

In the following description, it is assumed that the induced electromotive force that occurs in parasitic inductance LP1 has an angular frequency of $\omega$, resistances R1-R6 have resistance values of R1-R6, respectively, and capacitors C1-C9 have capacitance values of C1-C9, respectively.

Reference potential terminal TREF of drive circuit 6 is connected to control emitter CE of switch element 12. Therefore, when an induced electromotive force occurs in parasitic inductance LP1, a potential difference VS corresponding to the induced electromotive force occurs between the reference potential of drive circuit 6 and the reference potential of input buffer 8. This potential difference VS causes a surge current IS to flow between the reference potential of drive circuit 6 and the reference potential of input buffer 8. Surge current IS caused by the induced electromotive force that occurs in parasitic inductance LP1 flows through a path extending through switch element 12, drive circuit 6, low-pass filter 2, low-pass filter 1, drive circuit 5 and switch element 11 in this order as shown in FIG. 1.

In drive device 101, the resistance values of resistances R1 and R2 as well as the capacitance values of capacitors C3 and C5 are set to satisfy relationships of (R1=R2), $((1/(\omega \times C3))<<R1)$ and $((1/(\omega \times C5))<<R1)$. Thereby, the values of surge currents flowing through respective resistances R1 and R2 become substantially equal to each other, and the values of voltage step-down caused in the respective resistances R1 and R2 by surge current IS become substantially equal to each other.

Owing to the above structure, drive control signal DRV received by drive circuit 6 does not change even when the induced electromotive force occurs in parasitic inductance LP1, and it is possible to prevent the switching operation of switch element 12 from being affected by the induced electromotive force.

Since the resistance values of resistances R1 and R2 are much larger than the interconnection resistance value of the path of surge current IS, the voltage corresponding to potential difference VS caused by the induced electromotive force between the reference potential of input buffer 8 and the reference potential of drive circuit 6 can be substantially entirely applied to resistances R1 and R2. Therefore, it is possible to prevent a malfunction and destruction of switch element 12, drive circuit 6 and input buffer 8.

Then, description will be given on an operation performed when the induced electromotive force occurs in parasitic inductance LP2 of AC power supply device 201 according to the first embodiment of the invention.

Reference potential terminal TREF of drive circuit 7 is connected to control emitter CE of switch element 13. Therefore, when the induced electromotive force occurs in parasitic inductance LP2, potential difference VS corresponding to the induced electromotive force occurs between the reference potential of drive circuit 7 and the reference potential of input buffer 8. This potential difference VS causes surge current IS to flow between the reference potential of drive circuit 7 and the reference potential of input buffer 8. Surge current IS caused by the induced electromotive force that occurs in parasitic inductance LP2 flows through a path extending through switch element 13, drive circuit 7, low-pass filters 3 and 1, drive circuit 5 and switch element 11 in this order.

In low-pass filter 4 of drive device 101, the resistance values of resistances R5 and R6 as well as the capacitance values of capacitors C9 and C5 are set to satisfy relationships of (R5=R6), $((1/(\omega \times C9))<<R5)$ and $((1/(\omega \times C5))<<R5)$. Thereby, the values of surge currents flowing through respective resistances R5 and R6 become substantially equal to each other, and the values of voltage step-down caused in respective resistances R5 and R6 by surge current IS become substantially equal to each other.

Owing to the above structure, drive control signal DRV received by drive circuit 7 does not change even when the induced electromotive force occurs in parasitic inductance LP2, and it is possible to prevent the switching operation of switch element 13 from being affected by the induced electromotive force.

Since the resistance values of resistances R5 and R6 are much larger than the interconnection resistance value of the path of surge current IS, the voltage corresponding to potential difference VS caused by the induced electromotive force between the reference potential of input buffer 8 and the reference potential of drive circuit 7 can be applied substantially entirely to resistances R5 and R6. Therefore, it is possible to prevent a malfunction and destruction of switch element 13, drive circuit 7 and input buffer 8.

The publications 1-6 have not disclosed the structure that causes the plurality of semiconductor elements connected in parallel to perform the switching operation according to the same timing, i.e., to perform switching between the on and off states according to the same timing.

In drive device 101, however, the resistance values and the capacitance values are set to satisfy a relationship, e.g., of $((R1+R2) \times C3 = R4 \times C7 = (R5+R6) \times C9)$. Thus, the time constants of low-pass filters 1-3 are set equal to each other. According to this structure, drive control signal DRV is transmitted from the output of bypass circuit 9 to the signal input terminals of drive circuits 5-7 with delays of the same time, respectively, and the switching operations of switch elements 11-13 based on drive control signal DRV can be performed according to the same timing.

Low-path filter 4 in drive device 101 is configured to have the resistance value and the capacitance value satisfying a relationship, e.g., of $((1/(\omega \times C5))<<R3)$. This structure can prevent surge current IS from flowing to the output terminal of input buffer 8, and the malfunction and destruction of input buffer 8 can be prevented.

The reference potential of drive circuit 5 is the same as that of input buffer 8. Owing to this structure, drive control signal DRV received from input buffer 8 does not change even when the induced electromotive force occurs in parasitic inductance LP3, and it is possible to prevent the switching operation of switch element 11 from being affected by the induced electromotive force.

The publications 1-6 have not disclosed the structure reducing the influence of the induced electromotive force caused by the switching operations of the semiconductor elements in the drive device that drives, based on the common drive control signal, the plurality of semiconductor elements having the respective reference potential electrodes coupled via the main electrode unit.

However, the drive device according to the first embodiment of the invention can operate with respect to the induced electromotive force occurring, e.g., in parasitic inductance LP1 such that capacitor C3 passes the signal of the predetermined frequency or higher between the current path formed between resistance R1 and the signal input terminal of drive circuit 6 and the current path formed between resistance R2 and the reference potential terminal of drive circuit 6. Also, resistance R2 has substantially the same impedance as resistance R1.

As described above, the surge current caused by the induced electromotive force occurring in parasitic inductance LP1 flows through the current path between node N1 of bypass circuit 9 and the signal input terminal of drive circuit 6 as well as the current path that has substantially the same impedance as the above current path and is formed between node N2 of bypass circuit 9 and the reference potential terminal of drive circuit 6. Thereby, it is possible to prevent variations in drive control signal received by drive circuit 6.

In the drive device according to the first embodiment of the invention, the reference potential of drive circuit 5 is the same as that of input buffer 8. This structure can prevent the variations in drive control signal received by drive circuit 5 from input buffer 8 even when the induced electromotive force occurs in parasitic inductance LP3. According to the drive device of the first embodiment of the invention, therefore, the plurality of semiconductor elements having the respective reference potential electrodes coupled via the main electrode unit can be driven based on the common drive control signal, and the influence of the induced electromotive force caused by the switching operation of the semiconductor device can be reduced. Thereby, it is possible to improve flexibility in arrangement of each switch element and flexibility relating to the interconnections.

The publications 1-6 have not disclosed the structure that includes the input buffer receiving the drive control signal and the plurality of drive circuits driving the plurality of semiconductor elements having the respective reference potential electrodes coupled together based on the output signal of the input buffer, and is configured such that the common potential of at least one of the plurality of drive circuits is the same as the reference potential of the input buffer.

For example, in the drive device, it is assumed that the semiconductor element is internally provided with an element for current sensing, and a sensing circuit monitors a current flowing through the semiconductor element. In general, the drive device externally provides a result of monitoring by the sensing circuit. Therefore, the reference potential of the sensing circuit must be equal to the reference potential of the input buffer. If the reference potential of the input buffer is different from that of the drive circuit, the semiconductor element has the reference potential different from that of the sensing circuit. The difference in reference potential between the semiconductor element and the sensing circuit causes an error in the current sensing result.

However, in the drive device according to the first embodiment of the invention, the reference potential of drive circuit 5 is the same as that of input buffer 8 as already described. Owing to this structure, the current flowing through the semiconductor element and the like can be accurately measured by a unit or the like outside the drive device.

Even when it is assumed that drive device 101 does not have common mode inductances L1 and L2, and when the induced electromotive force occurs in parasitic inductance LP1, the induced electromotive force causes the surge current to pass through the path extending through the emitter of switch element 12, reference potential terminal TREF of drive circuit 6, power supply VD1, capacitor C6, reference potential terminal TREF of drive circuit 5 and the emitter of switch element 11 in this order. This surge current causes problems such as a malfunction and destruction of circuits due to crosstalk and voltage step-down in drive device 101.

However, in drive device 101 according to the first embodiment of the invention, the structure provided with common mode inductances L1 and L2 can prevent the current caused by the induced electromotive force from flowing through the foregoing path. Thus, drive circuits 5-7 can share one power supply VD1, and the influence of the induced electromotive force caused in the parasitic inductance can be prevented.

Another embodiment of the invention will now be described with reference to the drawings. The corresponding portions bear the same reference numbers, and description thereof is not repeated.

Second Embodiment

Figure 3:
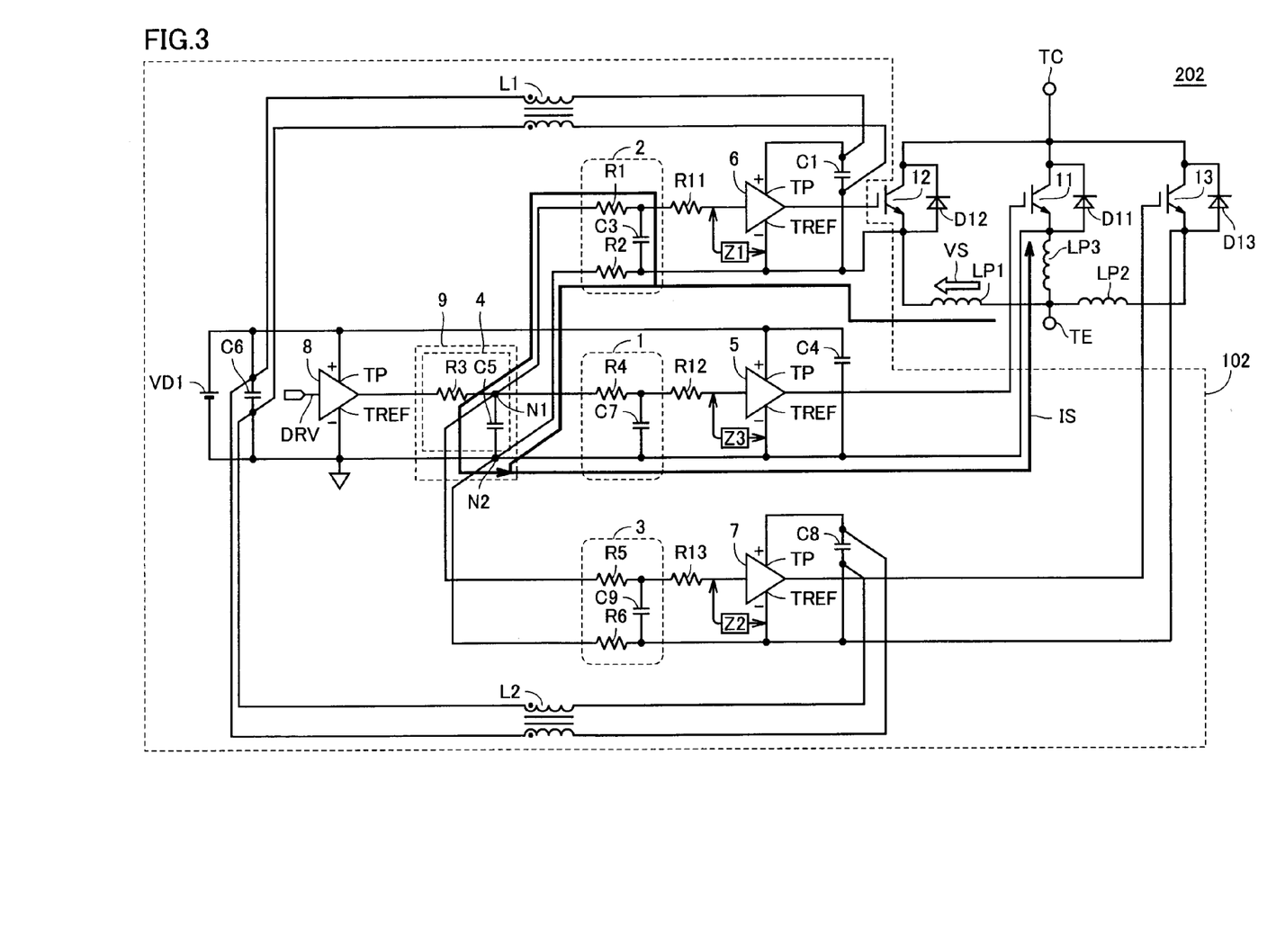
FIG. 3 is a circuit diagram showing a structure of an AC power supply device 202 according to a second embodiment of the invention.

A second embodiment relates to a drive device that is different from the drive device according to the first embodiment in that the drive device additionally includes a circuit for preventing flow of a surge current to an input terminal of the drive circuit FIG. 3 is a circuit diagram showing a structure of an AC power supply device 202 according to the second embodiment of the invention.

Referring to FIG. 3, a drive device 102 according to the second embodiment of the invention further includes resistances R11-R13, which are not employed in drive device 101 of the first embodiment of the invention.

Resistance (third load circuit) R11 is connected between the first end of capacitor C3 and the signal input terminal of drive circuit 6. Resistance (fourth load circuit) R12 is connected between the first end of capacitor C7 and the signal input terminal of drive circuit 5. Resistance (third load circuit) R13 is connected between the first end of capacitor C9 and the signal input terminal of drive circuit 7.

In a high frequency range, the input capacitance of the drive circuit lowers the input impedance of the drive circuit. In drive device 102, when the induced electromotive force occurs in parasitic inductance LP1, the surge current flows into drive circuit 6 via an input impedance Z1 of drive circuit 6 so that drive circuit 6 may malfunction or break. When the induced electromotive force occurs in parasitic inductance LP2, the surge current flows into drive circuit 7 via an input impedance Z2 of drive circuit 7 so that drive circuit 7 may malfunction or break. When the induced electromotive force occurs in parasitic inductance LP3, the surge current flows into drive circuit 5 via an input impedance Z3 of drive circuit 5 so that drive circuit 5 may malfunction or break.

It is assumed that resistances R11-R13 have the resistance values of R11-R13, respectively, and capacitors C3, C7 and C9 have the capacitance values of C3, C7 and C9, respectively. In drive device 102, the resistance values and the capacitance values are set to satisfy relationships of $((1/(\omega \times C3)) \ll R11)$, $((1/(\omega \times C7)) \ll R12)$ and $((1/(\omega \times C9)) \ll R13))$.

Since the above structure can prevent the surge current from flowing to the input terminals of drive circuits 5-7, the malfunction and destruction of drive circuits 5-7 can be prevented.

Other structures and operations are the same as those of the drive device according to the first embodiment, and therefore description thereof is not repeated.

Similarly to the drive device according to the first embodiment of the invention, therefore, the drive device according to the second embodiment of the invention drives the plurality of semiconductor elements having the respective reference potential electrodes coupled via the main electrode unit based on the common drive control signal, and can reduce the influence of the induced electromotive force caused by the switching operation of the semiconductor elements.

Still another embodiment of the invention will now be described with reference to the drawings. The corresponding portions bear the same reference numbers, and description thereof is not repeated.

Third Embodiment

This embodiment relates to a drive device that differs from the drive device according to the first embodiment in circuit structure between bypass circuit 9 and drive circuits 5-7.

[Structure and Basic Operation]

Figure 4:
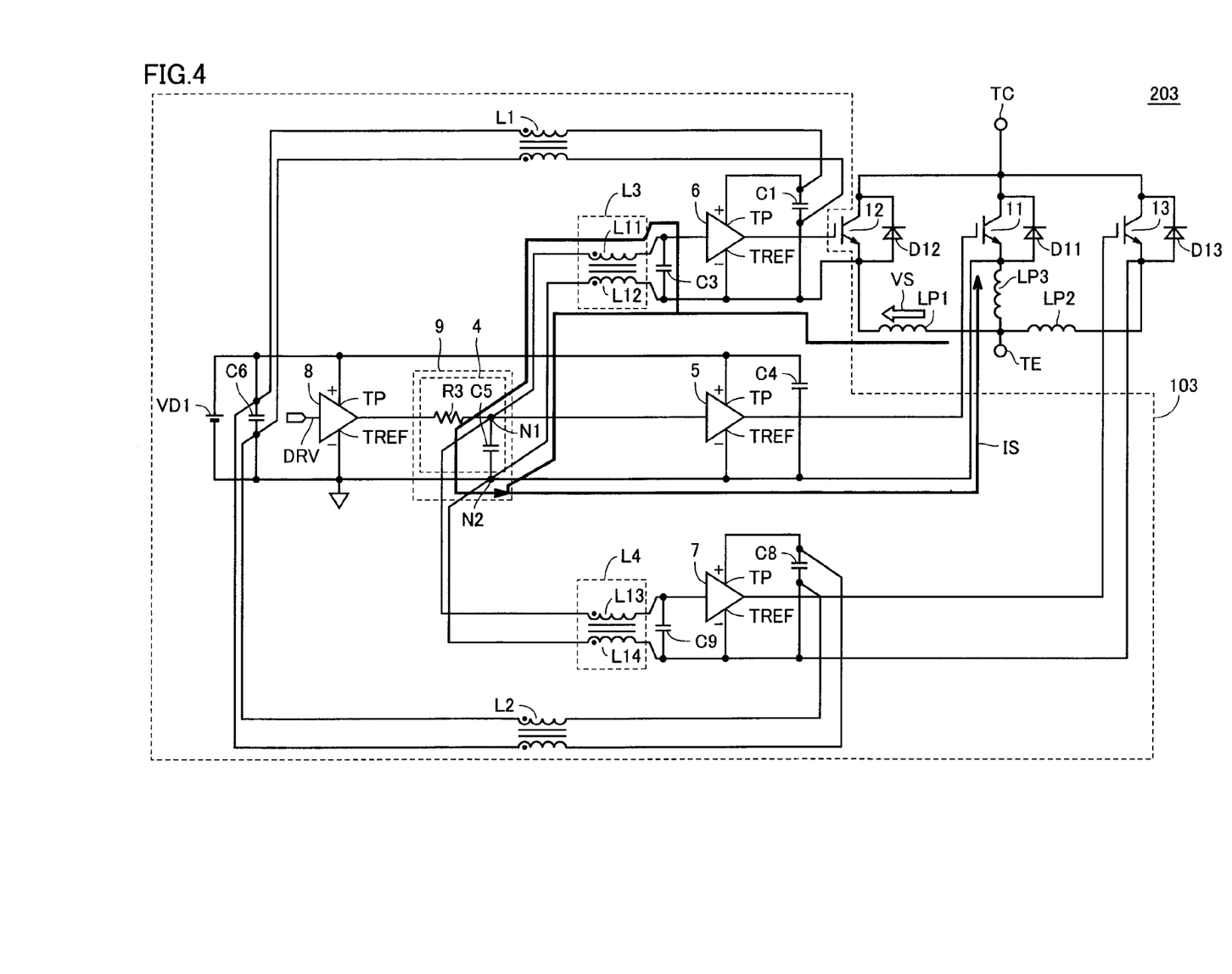
FIG. 4 is a circuit diagram showing a structure of an AC power supply device 203 according to a third embodiment of the invention.

FIG. 4 is a circuit diagram showing an AC power supply device 203 according to a third embodiment of the invention.

Referring to FIG. 4, AC power supply device 203 according to the third embodiment of the invention includes a drive device 103, switch elements (first to third semiconductor elements) 11-13, collector main electrode terminal TC and emitter main electrode terminal TE. Drive device 103 includes common mode choke coils L3 and L4, drive circuits 5-7, input buffer 8, bypass circuit (first bypass circuit) 9, power supply VD1, common mode inductances L1 and L2, capacitor (second bypass circuit) C3, capacitor (second bypass circuit) C9 and capacitors C1, C4, C6 and C8. Common mode choke coil L3 includes choke coils L11 and L12. Common mode choke coil L4 includes choke coils L13 and L14. Bypass circuit 9 has node N1 corresponding to a connection node of the second end of resistance R3 and the first end of capacitor C5, and node N2 corresponding to a connection node of the second end of capacitor C5.

The first end of resistance R3 is connected to the output terminal of input buffer 8, and the second end thereof is connected to the first end of capacitor C5, the signal input terminal of drive circuit 5, a first end of choke coil L11 and a first end of choke coil L13. A second end of choke coil L11 is connected to the first end of capacitor C3 and the signal input terminal of drive circuit 6. Reference potential terminal TREF of drive circuit 6 is connected to the emitters of switch elements 11-13, the second end of capacitor C1, the second end of capacitor C3 and a second end of choke coil L12. Reference potential terminal TREF of drive circuit 5 is connected to the emitters of switch elements 11-13, the second end of capacitor C4, the second end of capacitor C5, reference potential terminal TREF of input buffer 8, a first end of choke coil L12, a first end of choke coil L14, the second end of capacitor C6 and the negative electrode of power supply VD11. A second end of choke coil L13 is connected to the first end of capacitor C9 and the signal input terminal of drive circuit 7. Reference potential terminal TREF of drive circuit 7 is connected to the emitters of switch elements 11-13, the second end of capacitor C8, the second end of capacitor C9 and a second end of choke coil L14.

Drive device 103 drives switch elements 11-13 based on externally received drive control signal DRV.

Input buffer 8 externally receives and amplifies drive control signal DRV such that drive control signal DRV may have a voltage amplitude of a value required for driving switch elements 11-13.

Low-pass filter 4 in bypass circuit 9 attenuates components of a predetermined frequency or higher of drive control signal DRV that is the output signal of input buffer 8. Bypass circuit 9 distributes drive control signal DRV passed through low-pass filter 4 to common mode choke coils L3 and L4 as well as drive circuit 5 from node N1.

Low-pass filter 4 may have a structure including inductances instead of the resistances.

Drive circuits 5-7 receive drive control signal DRV provided from bypass circuit 9 and control signals DRV passed through common mode choke coils L3 and L4, and provide them to the gates of switch elements 11-13, respectively. Drive circuits 5-7 do not perform the voltage amplification of drive control signal DRV in contrast to input buffer 8. Thus, drive circuits 5-7 have a voltage gain of one. Drive circuits 5-7 can drive loads of low impedances because they have, e.g., small output resistances.

Switch elements 11-13 are connected in parallel. More specifically, each collector thereof is connected to collector main electrode terminal TC, and each emitter (reference potential electrode) is connected to emitter main electrode terminal TE. Switch elements 11-13 switch the states between the on and off states based on drive control signals DRV received from drive circuits 5-7, respectively.

Bypass circuit 9 couples reference potential terminals TREF of drive circuits 5 and 6 via choke coil L12.

Choke coil L11 is connected to node N1 of bypass circuit 9 and the signal input terminal of drive circuit 6. Choke coil L12 has substantially the same impedance as choke coil L11, and is connected between node N2 of bypass circuit 9 and the reference potential terminal of drive circuit 6.

Capacitor C3 passes a signal of a predetermined frequency or higher between the second end, i.e., the end on the drive circuit 6 side of choke coil L11 and the second end, i.e., the end on the drive circuit 6 side of choke coil L12. Thus, capacitor C3 passes the signal of the predetermined frequency or higher between a current path formed between choke coil L11 and the signal input terminal of drive circuit 6 and the current path formed between choke coil L12 and the reference potential terminal of drive circuit 6.

Bypass circuit 9 passes a signal of a predetermined frequency or higher between the first end, i.e., the end on the bypass circuit 9 side of choke coil L11 and the first end, i.e., the end on the bypass circuit 9 side of choke coil L12. Thus, bypass circuit 9 passes the signal of the predetermined frequency or higher between nodes N1 and N2.

Bypass circuit 9 couples reference potential terminals TREF of drive circuits 5 and 7 via choke coil L14.

Choke coil L13 is connected between node N1 of bypass circuit 9 and the signal input terminal of drive circuit 7. Choke coil L14 has substantially the same impedance as choke coil L13, and is connected between node N2 of bypass circuit 9 and the reference potential terminal of drive circuit 7.

Capacitor C9 passes a signal of a predetermined frequency or higher between the second end, i.e., the end on the drive circuit 7 side of choke coil L13 and the second end, i.e., the end on the drive circuit 7 side of choke coil L14. Thus, capacitor C9 passes the signal of the predetermined frequency or higher between the current path formed between choke coil L13 and the signal input terminal of drive circuit 7 and the current path formed between choke coil L14 and the reference potential terminal of drive circuit 7.

Bypass circuit 9 passes a signal of a predetermined frequency or higher between the first end, i.e., the end on the bypass circuit 9 side of choke coil L13 and the first end, i.e., the end on the bypass circuit 9 side of choke coil L14. Thus, bypass circuit 9 passes the signal of the predetermined frequency or higher between nodes N1 and N2.

[Operation]

When the induced electromotive force occurs in parasitic inductance LP1 of AC power supply device 203 according to a third embodiment of the invention, the operation is performed as follows.

Reference potential terminal TREF of drive circuit 6 is connected to control emitter CE of switch element 12. Therefore, when an induced electromotive force occurs in parasitic inductance LP1, potential difference VS corresponding to the induced electromotive force occurs between the reference potentials of drive circuit 6 and input buffer 8. This potential difference VS causes surge current IS to pass between the reference potentials of drive circuit 6 and input buffer 8. Surge current IS caused by the induced electromotive force occurring in parasitic inductance LP1 flows through a path extending through switch element 12, drive circuit 6, common mode choke coil L3, drive circuit 5 and switch element 11 in this order.

In drive device 103, surge currents IS of substantially the same current value flow to bypass circuit 9 through choke coils L11 and L12, respectively. Therefore, surge current IS steps down the voltages by substantially the same values in choke coils L11 and L12, respectively.

According to the above structure, potential difference VS between the reference potentials of drive circuit 6 and input buffer 8 can prevent variations in normal mode voltage of common mode choke coil L3. Therefore, it is possible to prevent the variations in drive control signal DRV received by drive circuit 6, and it is possible to prevent the switching operation of switch element 12 from being affected by the induced electromotive force.

Surge currents IS flow through choke coils L11 and L12 in the same direction and thus to bypass circuit 9. Therefore, common mode choke coil L3 has a large impedance value with respect to surge current IS, and the voltage corresponding to potential difference VS that is caused between the reference potentials of input buffer 8 and drive circuit 6 by the induced electromotive force can be applied substantially entirely to common mode choke coil L3. Therefore, the malfunction and destruction of switch element 12, drive circuit 6 and input buffer 8 can be prevented.

In AC power supply device 203 according to the third embodiment of the invention, the operation is performed as follows when the induced electromotive force occurs in parasitic inductance LP2.

Reference potential terminal TREF of drive circuit 7 is connected to control emitter CE of switch element 13. Therefore, when the induced electromotive force occurs in parasitic inductance LP2, potential difference VS corresponding to the induced electromotive force occurs between the reference potentials of drive circuit 7 and input buffer 8. This potential difference VS causes surge current IS to flow between the reference potentials of drive circuit 7 and input buffer 8. Surge current IS caused by the induced electromotive force occurring in parasitic inductance LP2 flows through the path extending through switch element 13, drive circuit 7, common mode choke coil L4, drive circuit 5 and switch element 11 in this order.

In drive device 103, surge currents IS of substantially the same current values flow through choke coils L13 and L14 to bypass circuit 9, respectively. Therefore, the values of voltage step-down caused in respective choke coils L13 and L14 by surge current IS are substantially equal to each other.

The above structure can prevent variations that may occur in normal mode voltage of common mode choke coil L4 due to potential difference VS between the reference potentials of drive circuit 7 and input buffer 8. Therefore, it is possible to prevent the variations in drive control signal DRV received by drive circuit 7, and to prevent the switching operation of switch element 13 from being affected by the induced electromotive force.

Surge currents IS flow through choke coils L13 and L14 in the same direction and thus to bypass circuit 9. Therefore, common mode choke coil L4 has a large impedance value with respect to surge current IS, and the voltage corresponding to potential difference VS that is caused between the reference potentials of input buffer 8 and drive circuit 7 by the induced electromotive force can be applied substantially entirely to common mode choke coil L4. Therefore, the malfunction and destruction of switch element 13, drive circuit 7 and input buffer 8 can be prevented.

Since common mode choke coils L3 and L4 have the impedances of substantially zero with respect to drive control signal DRV that is the normal mode signal, the times of delay of drive control signal DRV caused between the output of bypass circuit 9 and the respective signal input terminals of drive circuits 6 and 7 are substantially zero. Therefore, the time of delay of drive control signal DRV caused between bypass circuit 9 and drive circuit 5, i.e., the path not including the common mode choke coil is equal to that of delay of drive control signal DRV caused between bypass circuit 9 and drive circuits 6 and 7. Accordingly, switch elements 11-13 can perform the switching operation according to the same timing based on drive control signal DRV.

Other structures and operations are the same as those of the drive device according to the first embodiment, and therefore description thereof is not repeated.

Similarly to the drive device according to the first embodiment of the invention, therefore, the drive device according to the third embodiment of the invention drives the plurality of semiconductor elements having the respective reference potential electrodes coupled via the main electrode unit based on the common drive control signal, and can reduce the influence of the induced electromotive force caused by the switching operation of the semiconductor elements.

Yet another embodiment of the invention will now be described with reference to the drawings. The corresponding portions bear the same reference numbers, and description thereof is not repeated.

Fourth Embodiment

This embodiment relates to a drive device that differs from the drive device according to the third embodiment in that the drive device additionally includes a circuit preventing the surge current from flowing to the input terminal of the drive circuit.

Figure 5:
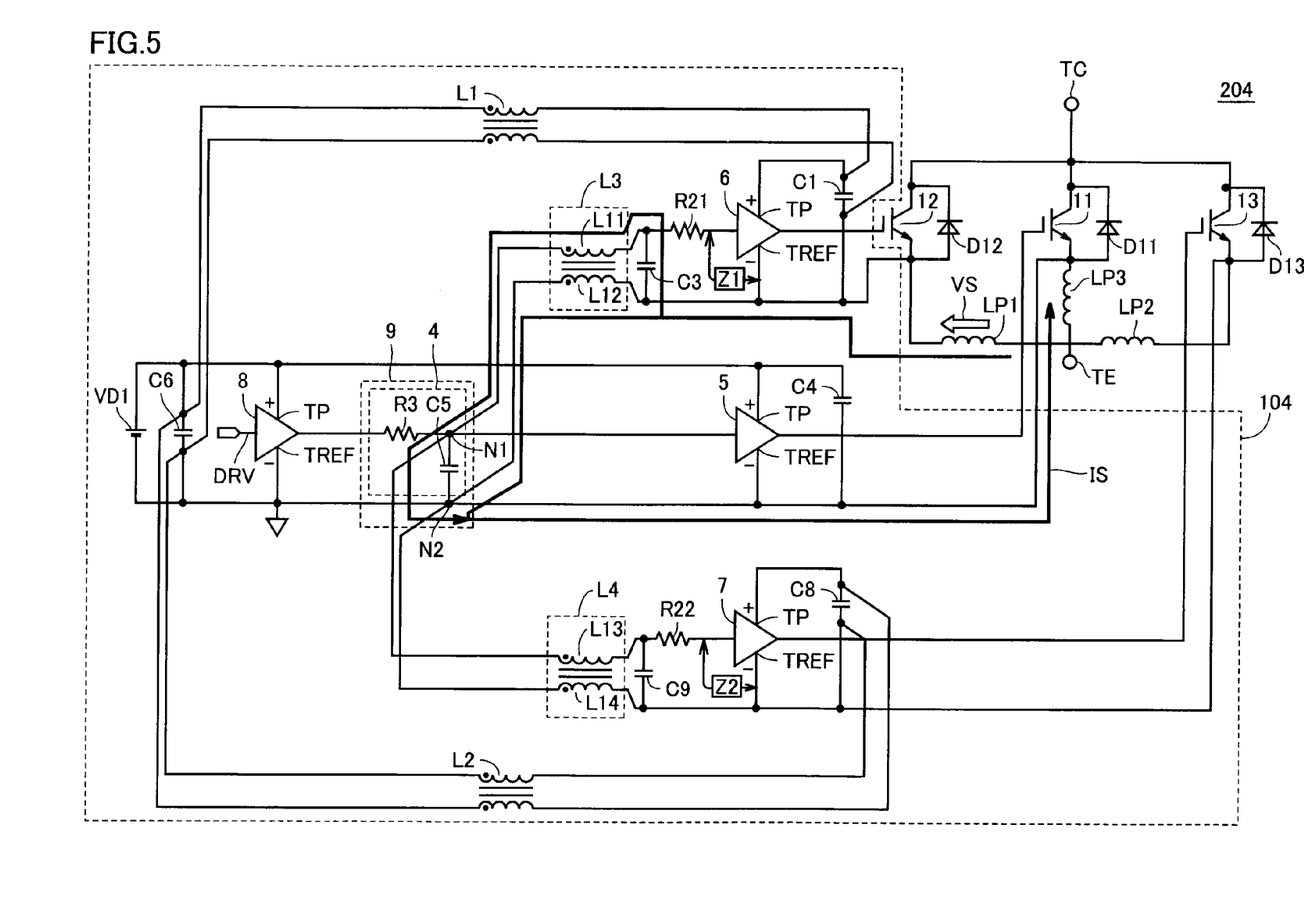
FIG. 5 is a circuit diagram showing a structure of an AC power supply device 204 according to a fourth embodiment of the invention.

FIG. 5 is a circuit diagram illustrating a structure of an AC power supply circuit 204 according to a fourth embodiment of the invention.

Referring to FIG. 5, a drive device 104 according to the fourth embodiment of the invention differs from the drive device according to the third embodiment of the invention in that resistances R21 and R22 are additionally employed.

Resistance (third load circuit) R21 is connected between the first end of common mode choke coil L3 and the signal input terminal of drive circuit 6. Resistance (third load circuit) R22 is connected between the first end of common mode choke coil L4 and the signal input terminal of drive circuit 7.

In a high frequency range, the input capacitance of the drive circuit lowers the input impedance of the drive circuit. In drive device 104, when the induced electromotive force occurs in parasitic inductance LP1, the surge current flows into drive circuit 6 via input impedance Z1 of drive circuit 6 so that drive circuit 6 may malfunction or break. When the induced electromotive force occurs in parasitic inductance LP2, the surge current flows into drive circuit 7 via input impedance Z2 of drive circuit 7 so that drive circuit 7 may malfunction or break.

It is assumed that resistances R21 and R22 have the resistance values of R21 and R22, respectively, and capacitors C3 and C9 have the capacitance values of C3 and C9, respectively. In drive device 104, the resistance values and the capacitance values are set to satisfy relationships of $((1/\omega \times C3)) << R21)$ and $((1/\omega \times C9)) << R22))$.

The above structure can prevent the surge current from flowing to the input terminals of drive circuits 6 and 7, and can prevent the malfunction and destruction of drive circuits 6 and 7.

Other structures and operations are the same as those of the drive device according to the third embodiment, and therefore description thereof is not repeated.

Similarly to the drive device according to the third embodiment of the invention, therefore, the drive device according to the fourth embodiment of the invention drives the plurality of semiconductor elements having the respective reference potential electrodes coupled via the main electrode unit based on the common drive control signal, and can reduce the influence of the induced electromotive force caused by the switching operation of the semiconductor elements.

Further another embodiment of the invention will now be described with reference to the drawings. The corresponding portions bear the same reference numbers, and description thereof is not repeated.

Fifth Embodiment

This embodiment relates to a drive device that differs from the drive device according to the fourth embodiment in that the delay times of the respective drive control signals are equal to each other.

Figure 6:
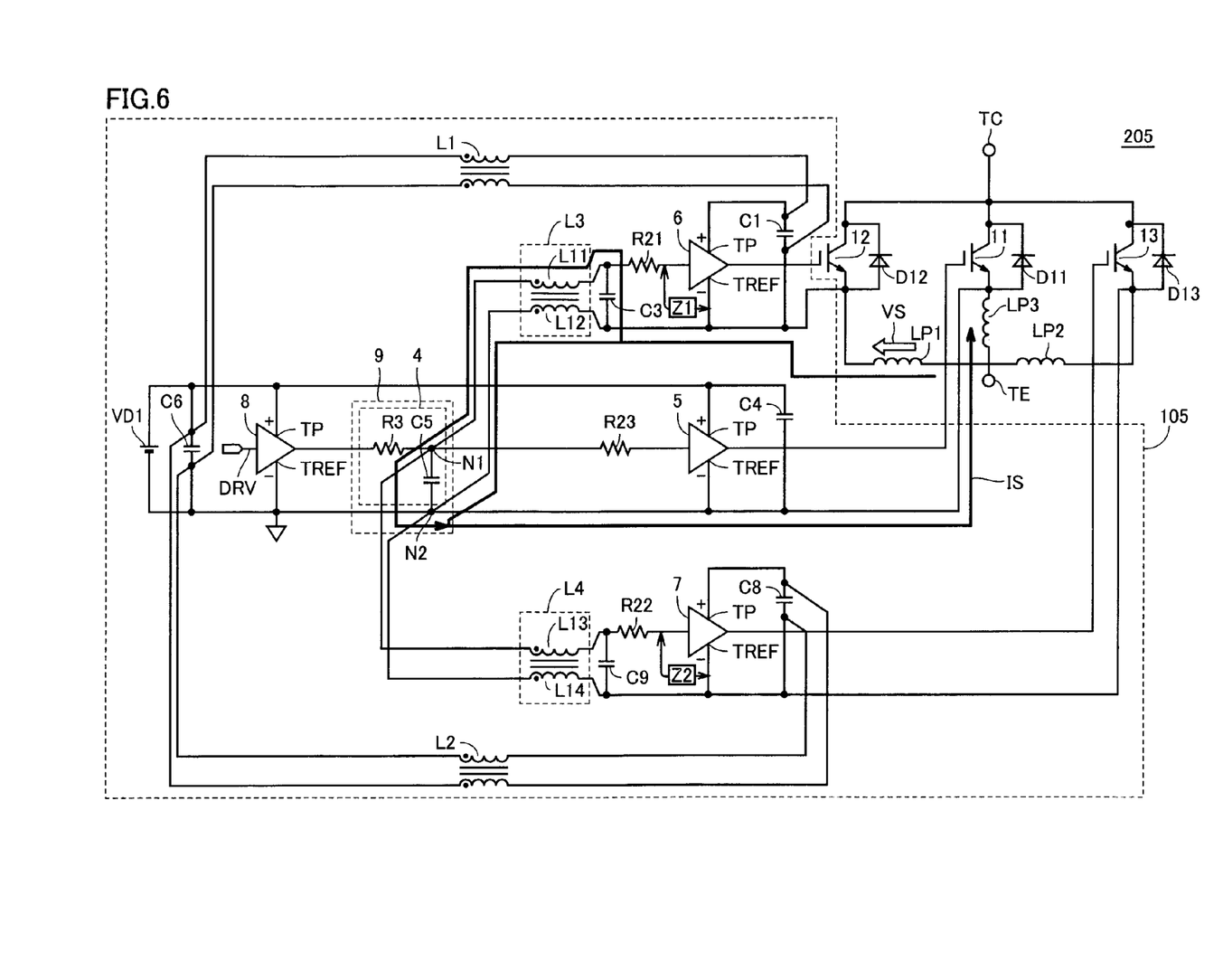
FIG. 6 is a circuit diagram showing a structure of an AC power supply device 205 according to a fifth embodiment of the invention.

FIG. 6 is a circuit diagram illustrating a structure of an AC power supply circuit 205 according to a fifth embodiment of the invention.

Referring to FIG. 6, a drive device 105 according to the fifth embodiment of the invention differs from the drive device according to the fourth embodiment of the invention in that a resistance (fourth load circuit) R23 is additionally employed.

Resistance (fourth load circuit) R23 is connected between node N1 and the signal input terminal of drive circuit 5.

Resistances R21-R23 have substantially the same impedances. Owing to this structure, the times of delay of drive control signals DRV caused between the output of bypass circuit 9 and the respective signal input terminals of drive circuits 5-7 are equal to each other, and switch elements 11-13 can perform the switching operation according to the same timing based on drive control signal DRV.

Other structures and operations are the same as those of the drive device according to the fourth embodiment, and therefore description thereof is not repeated.

Similarly to the drive device according to the fourth embodiment of the invention, therefore, the drive device according to the fifth embodiment of the invention drives the plurality of semiconductor elements having the respective reference potential electrodes coupled via the main electrode unit based on the common drive control signal, and can reduce the influence of the induced electromotive force caused by the switching operation of the semiconductor elements.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A drive device for driving first and second semiconductor elements having respective reference potential electrodes coupled via a main electrode unit, comprising:
    an input buffer receiving a drive control signal;
    a first bypass circuit including first and second nodes, receiving an output signal of said input buffer and providing a signal from said first node;
    a first drive circuit including a reference potential terminal coupled to a reference potential electrode of said input buffer, the second node of said first bypass circuit and the reference potential electrode of said first semiconductor element, and a signal input terminal receiving the output signal from the first node of said first bypass circuit, and supplying a voltage to a control electrode of said first semiconductor element;
    a second drive circuit including a reference potential terminal coupled to the second node of said first bypass circuit and the reference potential electrode of said second semiconductor element, and a signal input terminal receiving the output signal from the first node of said first bypass circuit, and supplying a voltage to a control electrode of said second semiconductor element;
    a first load circuit connected between the first node of said first bypass circuit and the signal input terminal of said second drive circuit;
    a second load circuit having substantially the same impedance as said first load circuit, and connected between the second node of said first bypass circuit and the reference potential terminal of said second drive circuit; and
    a second bypass circuit passing a signal of a predetermined frequency or higher between a current path formed between said first load circuit and the signal input terminal of said second drive circuit and a current path formed between said second load circuit and the reference potential terminal of said second drive circuit, wherein
    said first bypass circuit passes a signal of a predetermined frequency or higher between said first and second nodes.

2. The drive device according to claim 1, further comprising:
    a first low-pass filter connected between the first node of said first bypass circuit and the signal input terminal of said first drive circuit, and attenuating components of a predetermined frequency or higher among frequency components of the output signal provided from the first node of said first bypass circuit, wherein said first load circuit, said second load circuit and said second bypass circuit form a second low-pass filter attenuating components of a predetermined frequency or higher among the frequency components of the output signal provided from the first node of said first bypass circuit, and said first and second low-pass filters have substantially the same time constant.

3. The drive device according to claim 2, further comprising:
a third load circuit connected between said second low-pass filter and the signal input terminal of said second drive circuit; and
a fourth load circuit connected between said first low-pass filter and the signal input terminal of said first drive circuit.

4. The drive device according to claim 1, wherein
said first bypass circuit includes a low-pass filter attenuating components of a predetermined frequency or higher among frequency components of the output signal of said input buffer.

5. The drive device according to claim 1, wherein
said first and second load circuits form a common mode choke coil.

6. The drive device according to claim 5, further comprising:
a third load circuit connected between said second bypass circuit and the signal input terminal of said second drive circuit.

7. The drive device according to claim 6, further comprising:
a fourth load circuit connected between said first bypass circuit and the signal input terminal of said first drive circuit.

8. An alternating current power supply device comprising:
a main electrode unit;
first and second semiconductor elements having respective reference potential electrodes coupled via said main electrode unit;
an input buffer receiving a drive control signal;
a first bypass circuit including first and second nodes, receiving an output signal of said input buffer and providing a signal from said first node;
a first drive circuit including a reference potential terminal coupled to a reference potential terminal of said input buffer, the second node of said first bypass circuit and the reference potential electrode of said first semiconductor element, and a signal input terminal receiving an output signal from the first node of said first bypass circuit, and supplying a voltage to a control electrode of said first semiconductor element;
a second drive circuit including a reference potential terminal coupled to the second node of said first bypass circuit and the reference potential electrode of said second semiconductor element, and a signal input terminal receiving the output signal from the first node of said first bypass circuit, and supplying a voltage to a control electrode of said second semiconductor element;
a first load circuit connected between the first node of said first bypass circuit and the signal input terminal of said second drive circuit;
a second load circuit having substantially the same impedance as said first load circuit, and connected between the second node of said first bypass circuit and the reference potential terminal of said second drive circuit; and
a second bypass circuit passing a signal of a predetermined frequency or higher between a current path formed between said first load circuit and the signal input terminal of said second drive circuit and a current path formed between said second load circuit and the reference potential terminal of said second drive circuit, wherein
said first bypass circuit passes a signal of a predetermined frequency or higher between said first and second nodes.

* * * * *